United States Patent [19]

Shou et al.

[11] Patent Number: 5,606,274

[45] Date of Patent: Feb. 25, 1997

[54] SAMPLING AND HOLDING CIRCUIT

[75] Inventors: Guoliang Shou; Kazunori Motohashi; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 512,317

[22] Filed: Aug. 8, 1995

[30] Foreign Application Priority Data

Aug. 8, 1994 [JP] Japan ................................ 6-205978
Nov. 16, 1994 [JP] Japan ................................ 6-306923

[51] Int. Cl.$^6$ ............................................. G11C 27/02
[52] U.S. Cl. ................................. 327/94; 327/91
[58] Field of Search ......................... 327/91, 93, 94, 327/95, 96, 97, 63, 65, 99, 407, 554, 337

[56] References Cited

U.S. PATENT DOCUMENTS

| | | | |
|---|---|---|---|
| 4,363,976 | 12/1982 | Minor | 327/94 |
| 4,390,844 | 6/1983 | Ting | 327/94 |
| 4,523,107 | 6/1985 | Peterson | 327/95 |
| 4,698,523 | 10/1987 | Gershon et al. | 327/91 |
| 4,804,863 | 2/1989 | Welland et al. | 327/91 |
| 4,814,714 | 3/1989 | Beadle | 327/91 |
| 5,017,924 | 5/1991 | Guiberteau et al. | 327/94 |
| 5,061,865 | 10/1991 | Durst | 327/94 |
| 5,276,508 | 1/1994 | Boisvert et al. | 327/91 |
| 5,281,867 | 1/1994 | Campbell, Jr. et al. | 327/91 |
| 5,311,087 | 5/1994 | Suganuma | 327/94 |
| 5,367,154 | 11/1994 | Pfeiffer | 327/91 |
| 5,410,195 | 4/1995 | Ichihara | 327/94 |
| 5,446,375 | 8/1995 | Perkins | 327/94 |
| 5,479,120 | 12/1995 | McEwan | 327/91 |

FOREIGN PATENT DOCUMENTS

| | | | |
|---|---|---|---|
| 0400725 | 12/1990 | European Pat. Off. . | |
| 0319414 | 6/1989 | France . | |
| 402302999 | 12/1990 | Japan | 327/94 |
| 438927 | 7/1991 | Japan | 327/94 |

OTHER PUBLICATIONS

The Electrical Engineering Handbook, pp. 1804–1805, 1993, Richard C. Dorf, Editor–In–Chief.

Primary Examiner—Margaret Rose Wambach
Assistant Examiner—My-Trang Nu Ton
Attorney, Agent, or Firm—Cushman, Darby & Cushman IP Group of Pillsbury Madison & Sutro LLP

[57] ABSTRACT

An analog input voltage is inputted to a first sample and hold circuit and a second sample and hold circuit is connected to an output of the first sample and hold circuit. The output of the first and second sample and hold circuits are inputted to a multiplexer which alternatively outputs the output of first sample and hold circuit or the second sample and hold circuit. When one of the first and second sample and hold circuits is refreshed, the output of the other sample and hold circuit is selected to be outputted from the multiplexer.

12 Claims, 8 Drawing Sheets

SAMPLING AND HOLDING CIRCUIT

FIELD OF THE INVENTION

The present invention relates to a sampling and holding circuit for holding an analog or multi-valued voltage during a predetermined timing or for transferring the voltage up to a predetermined stage.

BACKGROUND OF THE INVENTION

Figure 13:
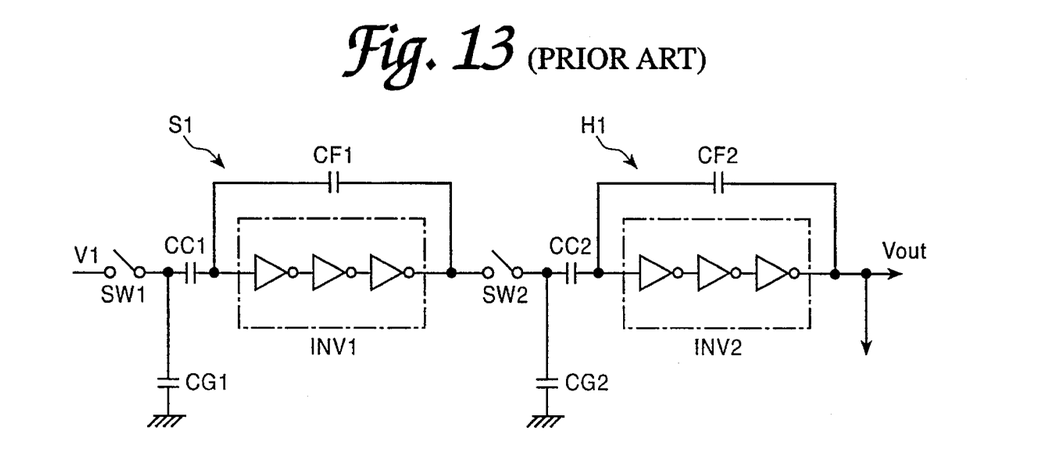
FIG. 13 is a circuit diagram showing a conventional sampling and holding circuit.

The inventors of the present invention have proposed a sampling and holding circuit for analog voltages in Japanese Patent Application Hei No. 05-045900 (FIG. 13). This circuit uses two sets of 3 stage serial inverters for holding data with good accuracy.

This type of circuit has disadvantages of large circuit size because of the inverters required for each sampling and holding circuit, particularly in the technical field of image processing or voice processing, where a lot of data is parallelly processed along a time sequence or for two or more dimensions.

As shown in FIG. 13, this sampling and holding circuit has a) a sampling circuit S1 with an odd number of serial MOS inverters, the inputs and outputs of which are connected through a feedback capacitance with each other, b) a switch SW1 for connecting an input voltage of the sampling circuit through a coupling capacitance CC2 and c) a switch SW2 for connecting the sampling circuit S1 and the coupling capacitance CC2. The data is held by capacitances CF1, CF2, CC1 and CC2 as electrical charges.

The electrical charge may remain in the MOS inverters, or in the capacitances so as to cause an offset voltage. However, refreshment is needed to delete the offset by short circuiting the inputs and outputs of the sampling and holding circuits S1 and H1. This refreshment undesirably causes a refresh noise at the output of the sampling and holding circuit.

SUMMARY OF THE INVENTION

The present invention has an object to provide a sampling and holding circuit free from refresh noise.

According to the present invention, there are provided a pair of sampling and holding circuits for alternatively holding data, and a multiplexer for alternatively selecting outputs from the sampling and holding circuits.

PREFERRED EMBODIMENT OF THE PRESENT INVENTION

Hereinafter, an embodiment according to the present invention is described with reference to the attached drawings.

Figure 1:
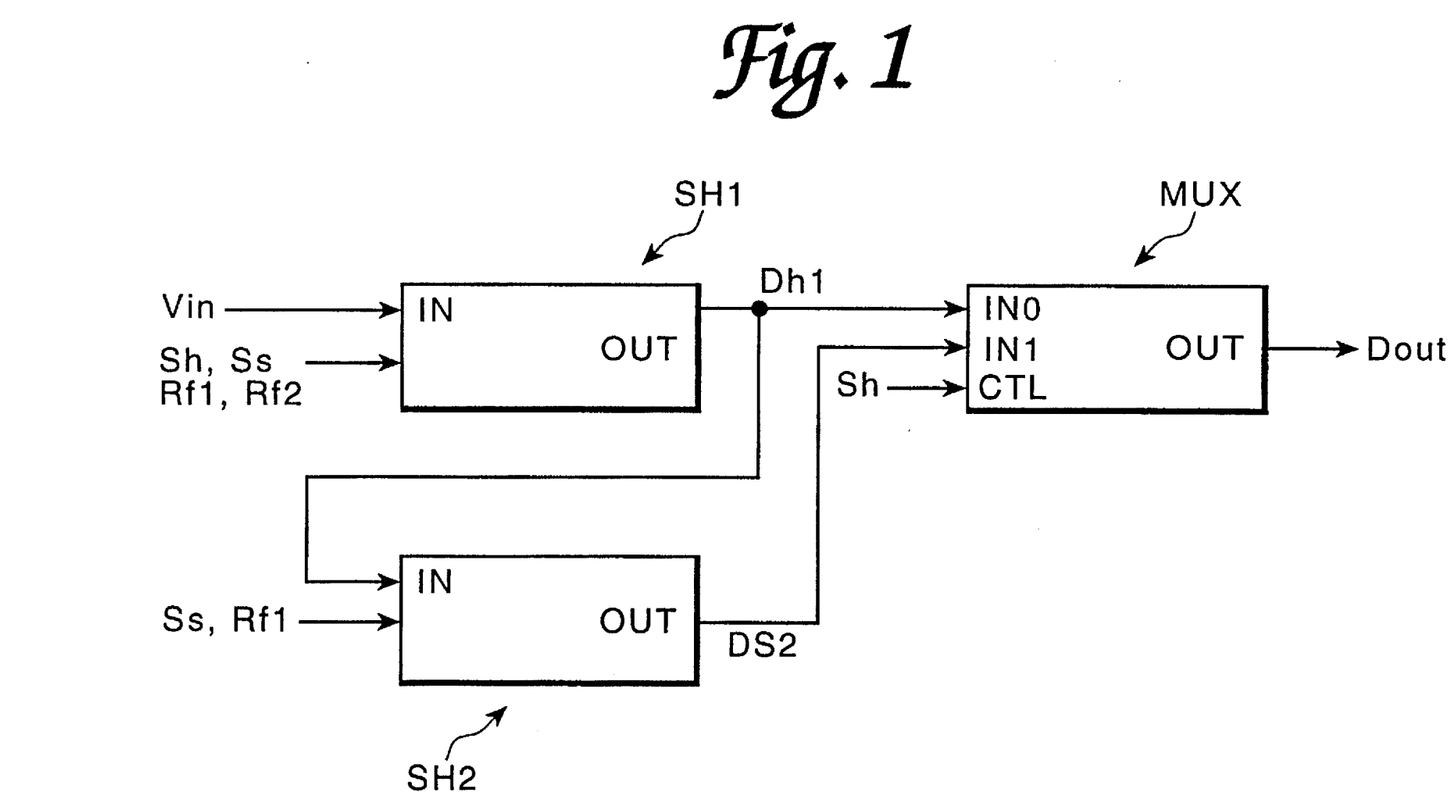
FIG. 1 is a block diagram showing the first embodiment of a sampling and holding circuit according to the present invention.

In FIG. 1, a sampling and holding circuit has the first sampling and holding circuit SH1, the second sampling and holding circuit SH2 and multiplexer MUX. An input voltage Vin is inputted to the first sampling and holding circuit SH1. The second sampling and holding circuit SH2 receives an output of the first sampling and holding circuit. The multiplexer MUX receives outputs of the first and the second sampling and holding circuits and alternatively outputs one of the outputs. A sampling signal Ss, holding signal Sh, first refreshing signal Rf1 and second refreshing Rf2 are inputted to the first sampling and holding circuit SH1, and the sampling signal Ss and first refreshing signal Rf1 are inputted to the second sampling and holding circuit SH2.

Sampling signal Ss executes sampling in sampling and holding circuits SH1 and SH2, and holding signal Sh executes holding in sampling and holding circuit SH1. This sampling corresponds to the data holding by S1 of the circuit in FIG. 13, and the holding corresponds to the data holding by H1 in FIG. 13.

Sampling and holding circuit SH2 receives the input from the sampling and holding circuit SH1; therefore the input voltage Vin reaches SH2 with a delay time of one sampling and holding timing. During this delay time, the multiplexer MUX introduces the output of SH2 instead of SH1 to the output OUT of the multiplexer MUX, while SH1 is refreshed. There is no influence from refresh noise in SH1. After the refreshment, MUX introduces the output from SH1 again. SH2 can be refreshed any time when SH1 is used.

Figure 2:
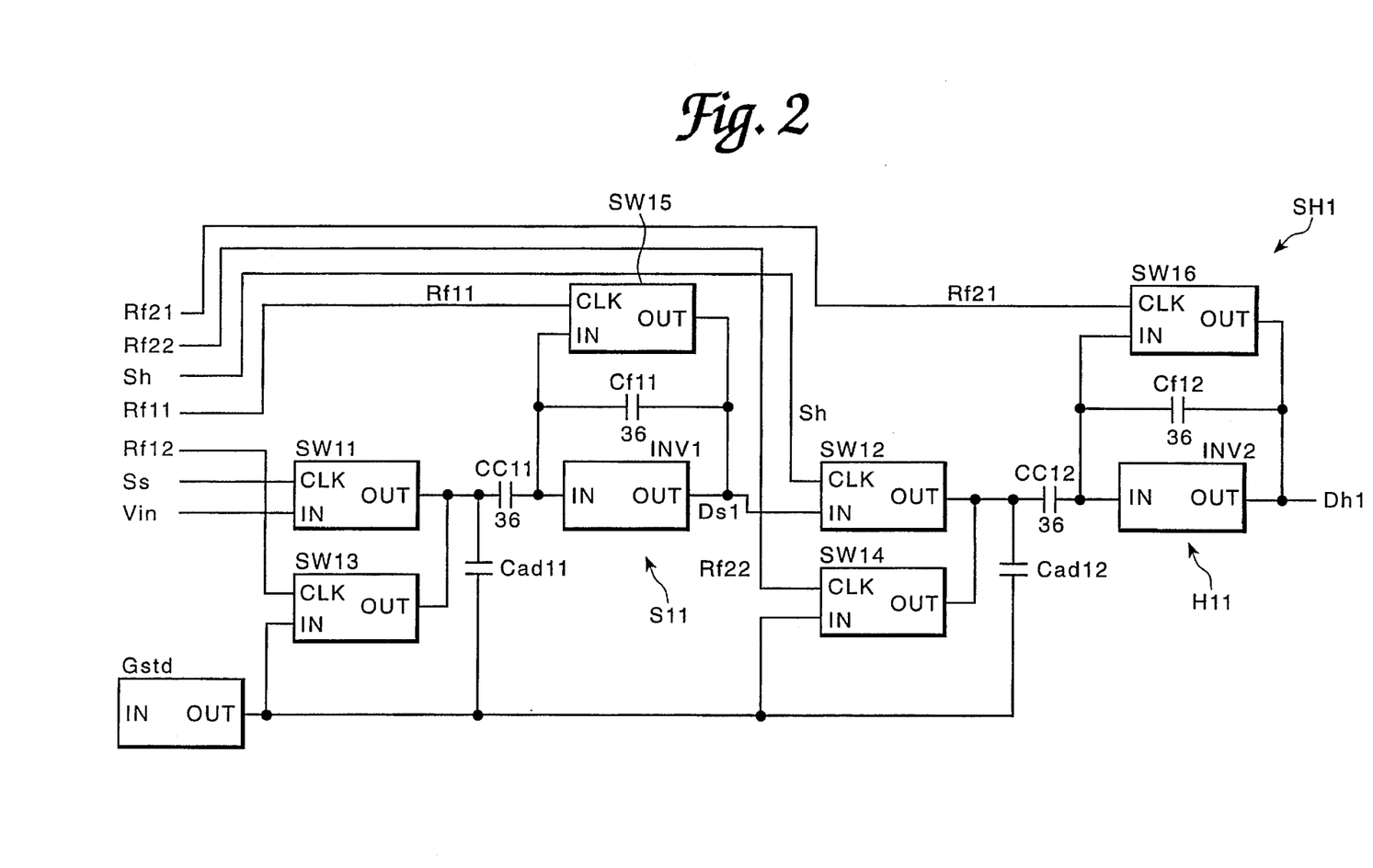
FIG. 2 is a circuit diagram of the first sampling and holding circuit of the first embodiment.

FIG. 2 is a circuit diagram showing the first sampling and holding circuit. Input voltage Vin is connected to a sampling circuit S11 through a switch SW11 and coupling capacitance CC11, and an output of sampling circuit S11 is connected to a holding circuit H11 through switch SW12 and coupling capacitance CC12.

Figure 5:
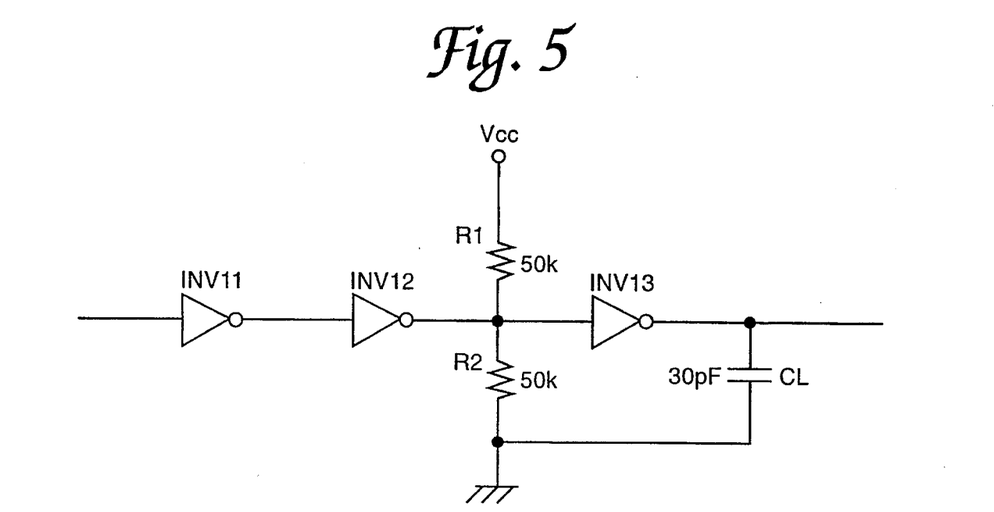
FIG. 5 is a circuit diagram of an inverter in the first embodiment.

The sampling circuit S11 is a serial circuit of three stages of MOS inverters INV11 to INV13, as shown in FIG. 5. The output of the final stage INV13 is fed through a feedback capacitance Cf11 back to the input of the first stage INV11. Since the inverters INV1 to INV2 have a high amplification gain, the output of S11 has good linearity and is an inverse of the input, that is, (Vdd–Vin). Vdd is the voltage of the electrical source for the inverters.

The holding circuit H11 is a serial circuit of three stages of MOS inverters INV11 to INV13, similar to S11, as shown in FIG. 5. The output of the final stage INV13 is fed through a feedback capacitance CF12 back to the input of INV11. When switch SW12 is closed, Vin as it is, that is, as inverter output of S11 is generated at the output of H11.

The sampling and holding circuit SH1 has switches SW13 to SW16 for refreshment of capacitances CC11, CC12, Cf11 and Cf12. When switches SW15 and SW16 are closed, refreshment is performed by impressing equal voltages on opposite terminals of capacitances Cf11 and Cf12. Switches SW13 and SW14 impress the reference voltage Vstd generated by a circuit Gstd to C11 and CC12 so as to reset the inputs of S11 and H11 to be the reference voltage.

Figure 8:
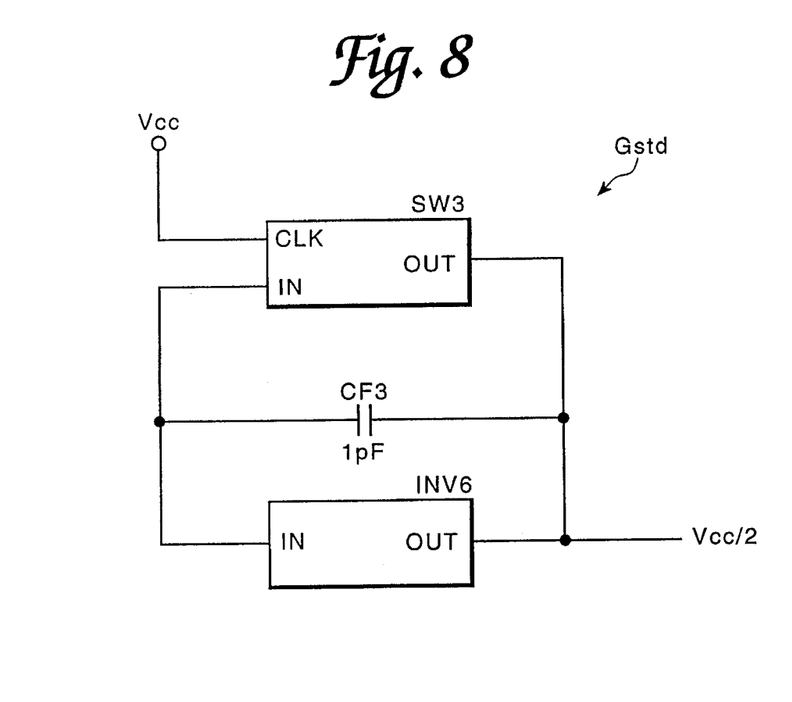
FIG. 8 is a circuit diagram of a reference voltage generating circuit in the first embodiment.
Figure 9:
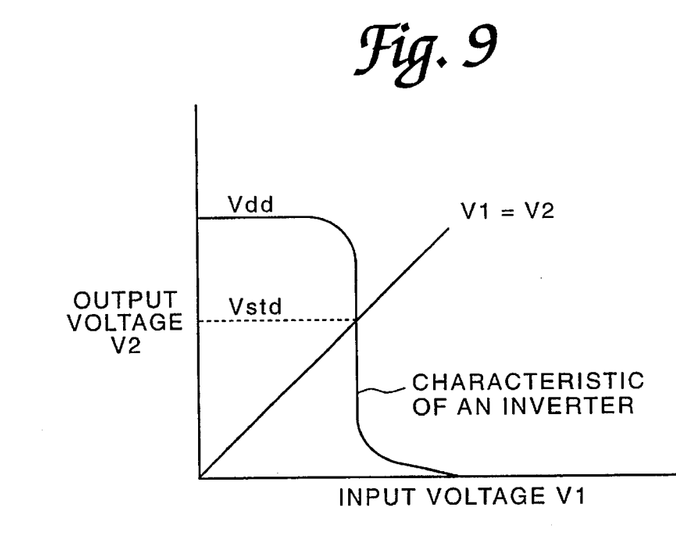
FIG. 9 is a graph showing characteristics of a reference voltage generating circuit.

As shown in FIG. 8, the circuit Gstd consists of a circuit INV6 of a plurality of MOS inverters of an even number of stages and a feedback capacitance CF3 shortcircuiting the input and output of the circuit. FIG. 9 is a graph showing how the reference voltage Vstd is determined. Vstd is a crossing point of a input/output characteristics curve of 3 stages of inverters and a straight line meaning that the input and output voltages are equal. Usually, it is preferable to define a condition of Vstd=Vdd/2.

Further, the circuit Gstd includes a refresh switch SW3 for connecting the opposite terminals of the capacitance CF3 and the circuit INV6. The accuracy of the reference voltage Vstd is compensated by the refreshment executed by the switch SW3.

In order to improve the capacity of electrical charge of S11, an additional capacitance Cad 11 is connected between switch SW11 and capacitance C11, and the other terminal of Cad 11 is connected to the reference voltage Vstd.

In order to improve the capacity of electrical charge of H11, an additional capacitance Cad 12 is connected between switch SW12 and capacitance CC12, and the other terminal of Cad12 is connected to the reference voltage from Gstd. When the switches SW13 and SW14 are closed, equal voltages are impressed on the opposite terminals of Cad 11 and Cad 12 so that the capacitances are refreshed.

Sampling signal Ss and holding signal Sh are inputted to switches SW11 and SW12, respectively. When Ss becomes high level, SW11 is closed, when Sh becomes high level, SW12 is closed. Ss and Sh are inputted at a timing shown in a timing chart of FIG. 10, and an output Ds1 of the sampling circuit S11 and output Dh1 of holding circuit H11 are generated. When a value of Vin is "a" at the timing that Ss is inputted, "a" is kept as Ds1. When Sh is input, "a" is transferred to a holding circuit and kept as Dh1.

The first refresh signal Rf1 consists of two signals Rf11 and Rf12. Signal Rf11 is inputted to switch SW15, and signal Rf12 is inputted to switch SW13. Rf1 refreshes S11 at an intermittent timing on every several times of sampling and holding. As soon as the refreshment is completed, Ss is inputted so that the sampling is started. Rf12 and Rf11 become high level simultaneously, and Rf12 becomes low level a little after Rf11 becomes low level. In order to perform the refreshment of capacitance CC11, it is necessary to keep a voltage of opposite terminals constant, but there is a possibility that a charged voltage is impressed to CC11 in a transient period, when Rf11 and Rf12 are finished in the same time. This unexpected charging is prevented by the above duration of Rf12.

The second refresh signal Rf2 consists of signals Rf21 and Rf22. Signal Rf21 is inputted to switch SW16, and signal Rf22 is inputted to switch SW14. Rf2 refreshes H11 at an intermittent timing on every several times of sampling and holding. As soon as the refreshment is completed, Sh is inputted so that the holding is started. Rf22 and Rf21 become high level simultaneously, and Rf22 becomes low level a little after Rf21 becomes low level. In order to perform refreshment of capacitance CC12, it is necessary to keep a voltage of opposite terminals constant, but there is a possibility that charged voltage is impressed to CC12 in a transient period, when Rf21 and Rf22 are finished in the same time. This unexpected charging is prevented by the above duration of Rf22.

Figure 3:
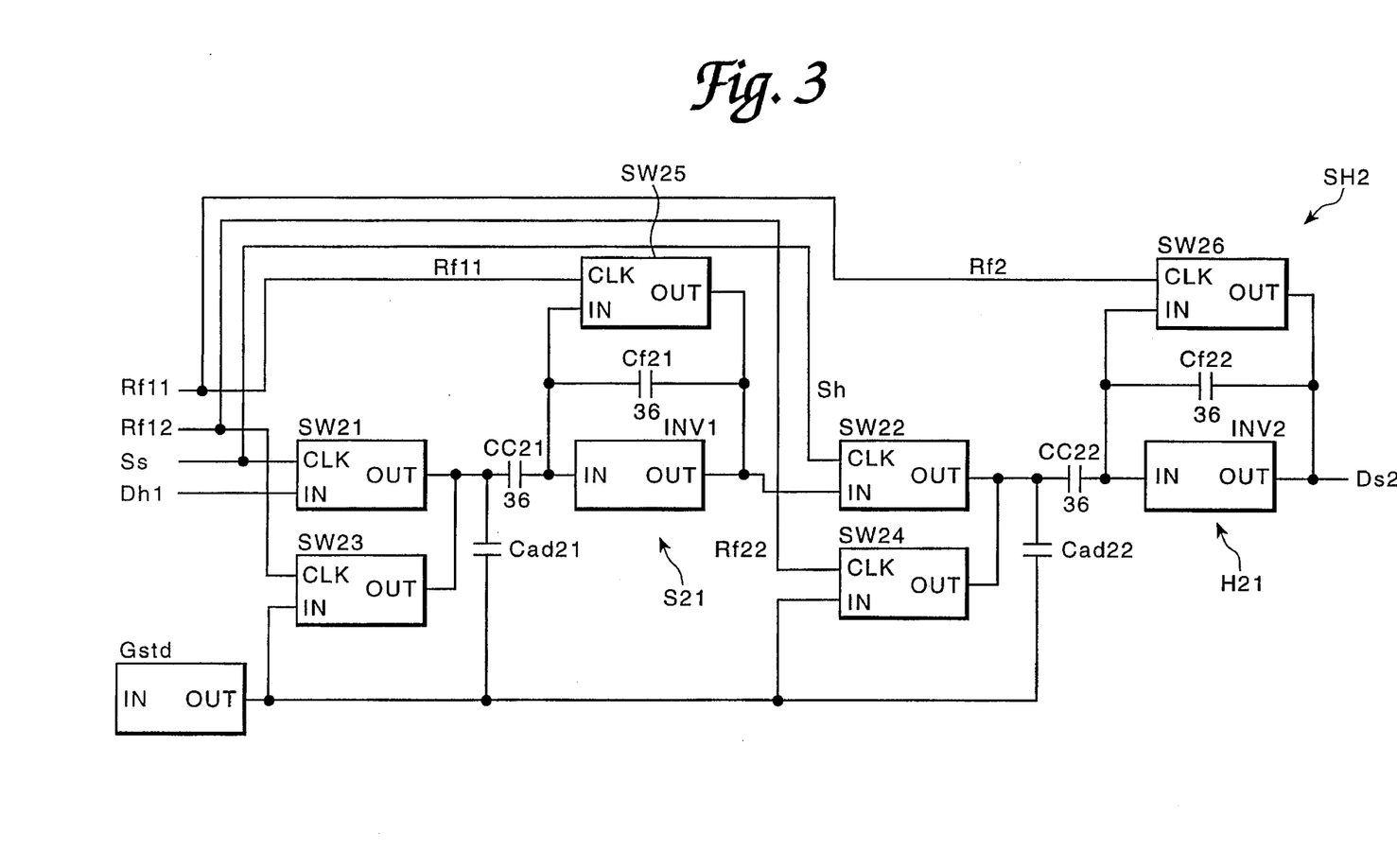
FIG. 3 is a circuit diagram showing the second sampling and holding circuit of the first embodiment.

FIG. 3 is a circuit diagram showing the second sampling and holding circuit SH2. The output of the sampling and holding circuit SH1 is connected to a sampling circuit S21 through a switch SW21 and coupling capacitance CC21. An output of sampling circuit S21 is connected to a holding circuit H21 through a switch SW22 and coupling capacitance CC22.

The sampling circuit S21 is a serial circuit of three stages of MOS inverters INV11 to INV13, as shown in FIG. 5. The output of the final stage INV13 is fed through a feedback capacitance Cf21 back to the input of the first stage INV11. Since the inverters INV11 to INV13 have a high amplification gain, the output of S21 has good linearity and is an inverse of the input, that is, (Vdd–Vin).

The holding circuit H21 is a serial circuit of three stages of MOS inverters INV11 to INV13, similar to S21, as shown in FIG. 5. The output of the final stage INV13 is fed through a feedback capacitance Cf22 back to the input of INV11. When switch SW22 is closed, Vin as it is, that is, an inverted output of S21 is generated at the output of H21.

The sampling and holding circuit SH2 has switches SW23 to SW26 for refreshment of capacitances CC21, CC22, Cf21 and Cf22. When switches SW25 and SW26 are closed, refreshment is performed by impressing equal voltages on opposite terminals of capacitances Cf21 and Cf22. Switches SW23 and SW24 impress the reference voltage Vdd/2 (a half source voltage Vdd) to CC21 and CC22 so as to reset the inputs of S21 and H21 to be the reference voltage.

In order to improve the capacity of electrical charge of S21, an additional capacitance Cad 21 is connected between switch SW21 and capacitance CC21, and the other terminal of Cad 21 is connected to the reference voltage Vstd generated by the circuit Gstd.

In order to improve capacity of electrical charge of H21, an additional capacitance Cad22 is connected between switch SW22 and capacitance CC22, and the other terminal of Cad 22 is connected to the reference voltage from the circuit Gstd. When the switches SW23 and SW24 are closed, equal voltages are impressed on the opposite terminals of Cad 21 and Cad22 so that the capacitances are refreshed.

Figure 10:
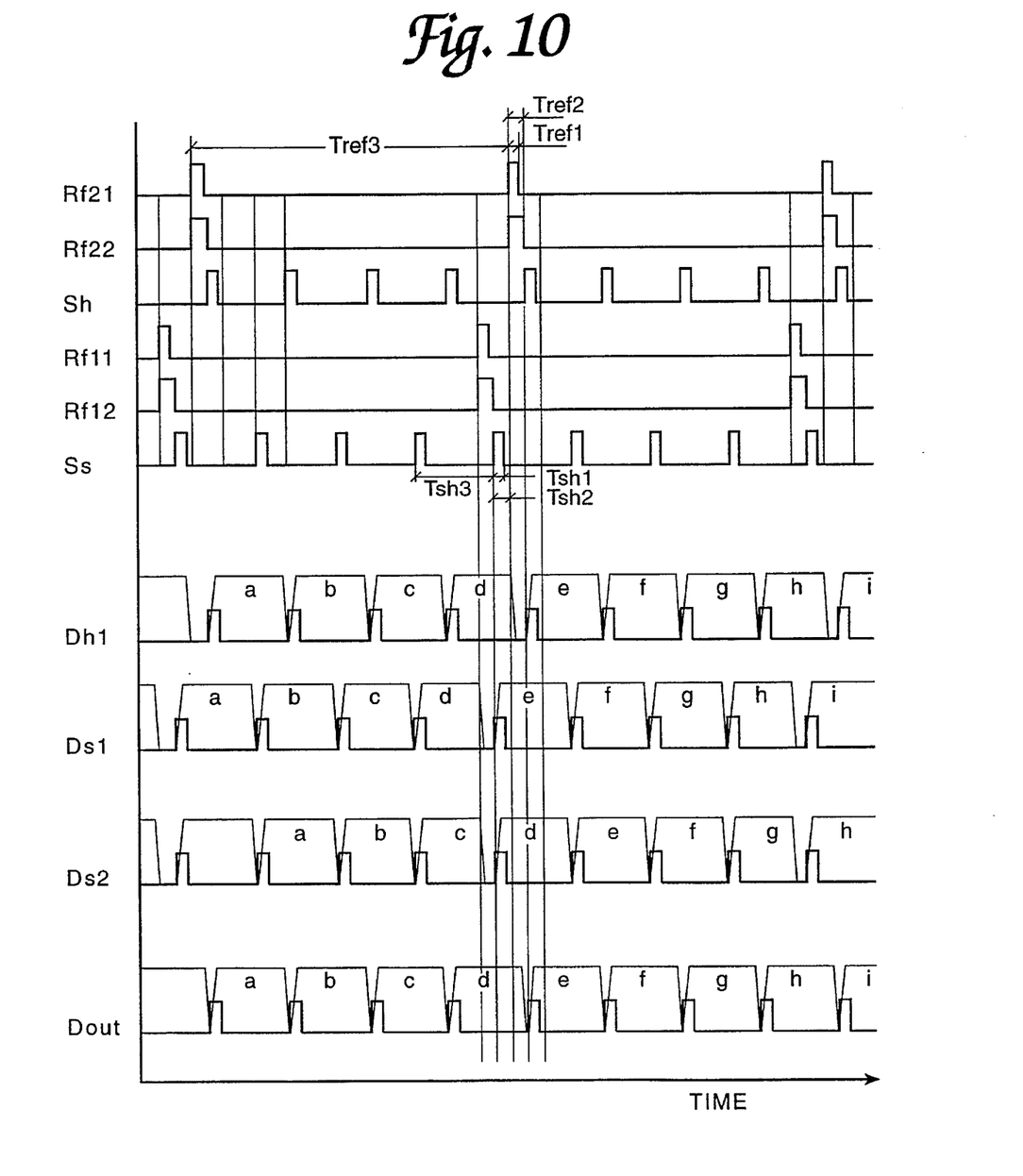
FIG. 10 is a timing chart showing the performance of the second embodiment.

Sampling signal Ss is inputted to the switches SW21 and SW22 so that the switches are closed when Ss becomes high level. The sampling and holding circuit SH2 takes the output of SH1 as an output Ds2 synchronously to the sampling timing of SH1. The timing of the output Ds2 is delayed by one sampling timing, as shown in FIG. 10.

Figure 4:
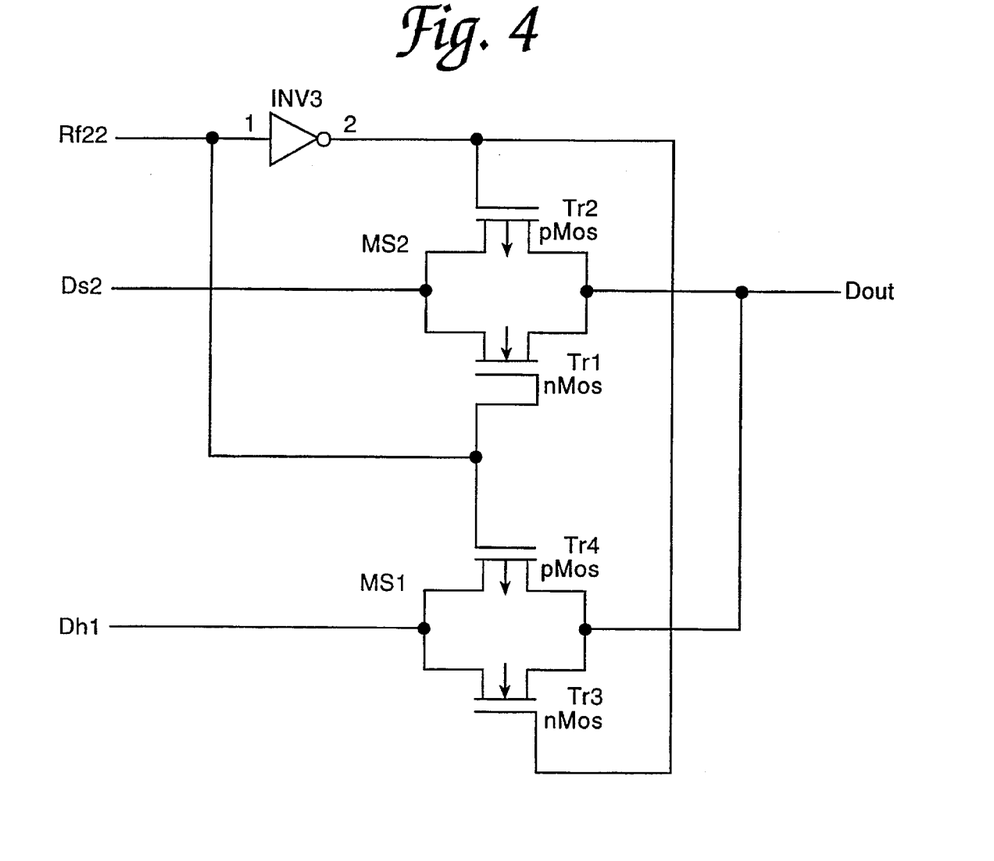
FIG. 4 is a circuit diagram of a multiplexer in the first embodiment.

As shown in FIG. 4, the outputs Dh1 and Ds2 and the signal Rf22 are inputted to the multiplexer MUX, and MUX alternatively passes Dh1 or Ds2 in response to the high and low level of Rf22. MUX has a pair of MOS switches MS1 and MS2 to which Dh1 and Ds2 are inputted, respectively. MS1 is closed when Rf22 is low level, and M22 is closed when Rf22 is high level. Each MOS switch is composed on nMOS and pMOS transistors serially connected from Vdd to ground and controlled by a pair of signals of inverse polarity to be inputted to gates of the nMOS and pMOS transistors. An inverted signal is generated by inputting Rf22 to a MOS inverter INV3.

When holding circuit H11 of SH1 is refreshed, Ds2 is outputted from MUX as the final output Dout. After the refreshment, MUX introduces the output from SH1 again. It is possible to continuously output Vin as the final output Dout, without any influence of the refresh noise in SH1. SH2 can be refreshed any time when SH1 is used.

As shown in the circuit of inverters INV11 to INV13 in FIG. 5, a capacitance CL is connected between the output of the final stage inverter INV13 and ground. The inverters have a low pass characteristic by the capacitance CL. An equilibrium resistance R1 and R2 are connected to a juncture of INV12 and INV13. R1 is connected to the voltage source Vcc and R2 is grounded. These resistances lower the gain of the circuit of three stages of inverters. As a result, unstable oscillations of S11, S21, H11 and S21 are prevented.

Figure 6:
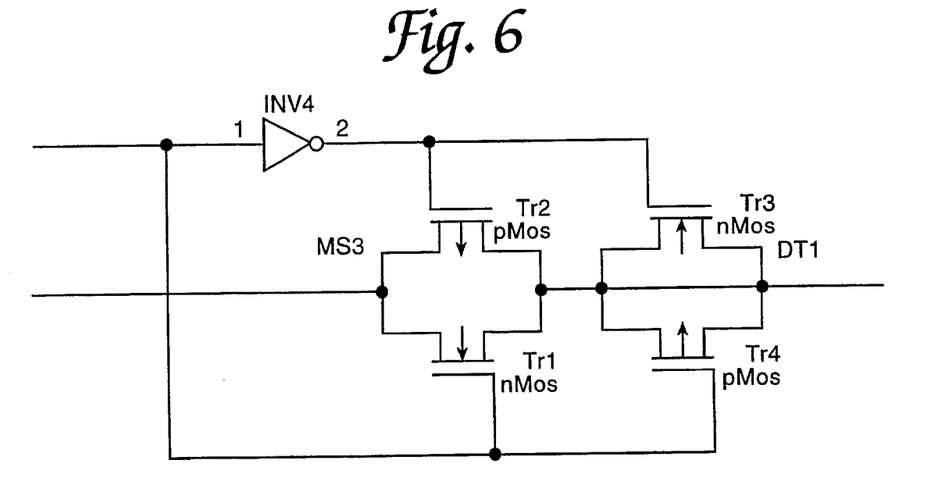
FIG. 6 is a circuit diagram of the first switch in the first embodiment.

As shown in FIG. 6, each of the switches SW11 to SW14 and SW21 to SW24 is a circuit of MOS switch MS3 and dummy transistor DT1 connected serially after the MOS switch MS3. An inverter INV4 is provided for generating an inverter signal for the pMOS transistor in the MOS switch and the nMOS transistor in the dummy transistor.

Figure 7:
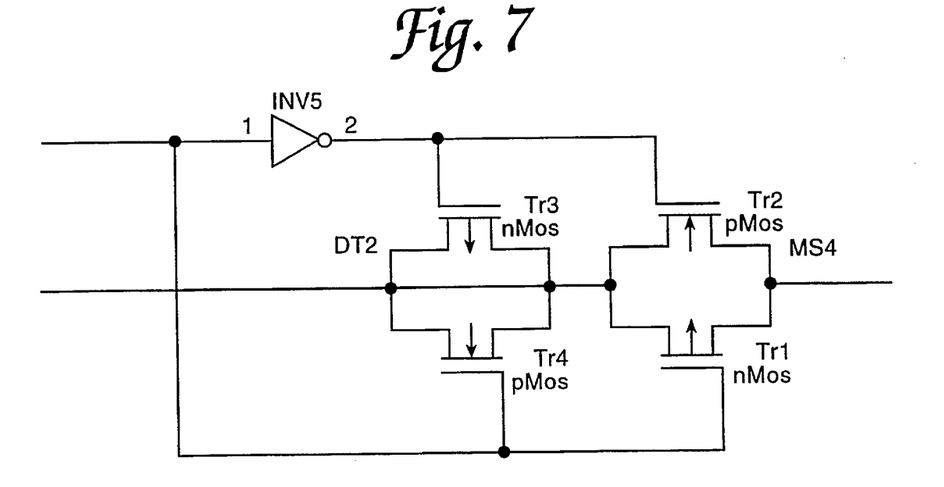
FIG. 7 is a circuit diagram of the second switch in the first embodiment.

As shown in FIG. 7, each of the switches SW15, SW16 and SW25 to SW26 is a circuit of MOS switch MS4. An inverter INV5 is provided for generating an inverter signal for the pMOS transistor in the MOS switch and the nMOS transistor in the dummy transistor.

Hereinafter, a second embodiment of a sampling and holding circuit according to the present invention is described with reference to the attached drawings. In this embodiment, a plurality of analog input voltages can be held in the first sampling and holding circuit.

Figure 11:
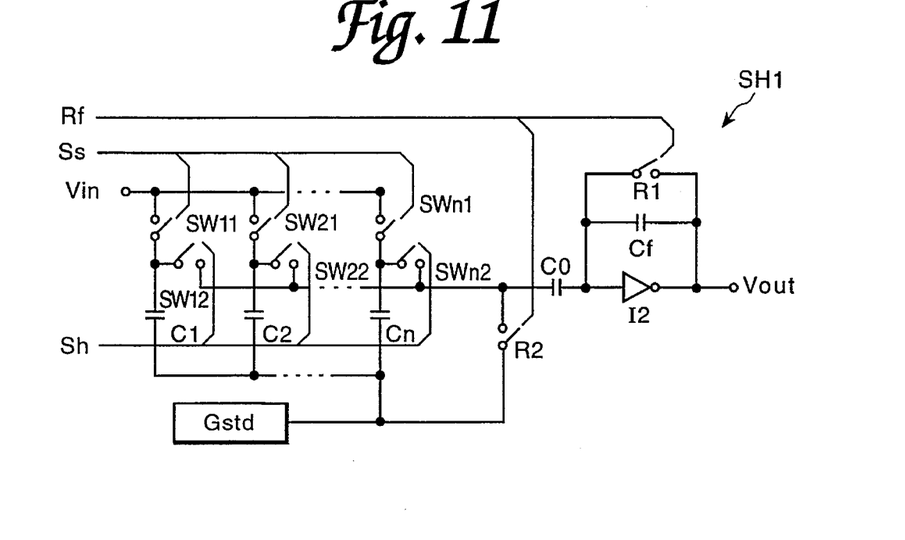
FIG. 11 is a circuit diagram showing the first sampling and holding circuit of the second embodiment.

A sampling and holding circuit similar to the first embodiment has the first sampling and holding circuit as shown in FIG. 11. The first sampling and holding circuit has a plurality of input switches SW11, SW21 to SWn1 parallelly connected to input voltage Vin, and each of these input switches is connected to one of a plurality of sampling and holding capacitances C1, C2 . . . and Cn, respectively. The sampling and holding capacitances C1 to Cn are connected at the first terminal t11 to tn1 to a common reference voltage source Gstd, and the input switches SW11 to SWn1 are connected to the second terminals t12 to tn2 of capacitances C1 to Cn, respectively. The reference voltage Vstd is stably impressed on each capacitance C1 to Cn.

The second terminal of capacitances C1 to Cn are connected to output switches SW12, SW22 . . . and SWn2, respectively. These switches are parallel to the input switches SW11 to SWn1 and are connected to an output capacitance C0 corresponding to the capacitance C12 in FIG. 2. After the capacitance C0, an inverter I2, feedback capacitance Cf and refresh switch R1 are connected similar to the INV2, Cf12 and SW16 in FIG. 2. Then, a voltage inputted to capacitance C0 is outputted as a stable inverter output Vout. The above Vstd changes depending on the characteristics of the amplifier I1, mainly on an offset voltage of the amplifier. Both amplifiers I1 and I2 are positioned closely in a large scale integrated circuit (LSI) so as to be substantially equal to each other in their characteristics, and total accuracy becomes high because both offset voltages of I1 and I2 cancel each other.

If the electrical charges of capacitances C0 and Cf are completely discharged, the following formula (1) is valid under the condition that a potential difference at opposite terminals of capacitance C0 is $\Delta V$.

$$Vout = Vstd - (C0/Cf)(\Delta V) \quad (1)$$

When one of the output switches is selectively closed under the condition of the following formula (2), and it is defined that a voltage held by the capacitance Ci is Vi when the closed switch is SWi2, $$C0 = C1 = C2 = \ldots = Cn \quad (2)$$

the following formula (3) is obtained.

$$\Delta V = Ci(Vi - Vstd)/(C0 + Ci) = (Vi - Vstd)/2 \quad (3)$$

Then formula (3) is substituted for $\Delta V$ in formula (1), and formula (4) is obtained.

$$Vout = Vstd - (C0/Cf)(Vi - Vstd)/2 \quad (4)$$

Furthermore, when $$Cf = C0/2 \quad (5)$$

Formula (4) is changed by substitution of formula (5), to be formula (6).

$$Vout = Vdd - Vi \quad (6)$$

The formula (6) means that the held voltage is outputted as it is.

On the other hand, when the input switch is closed during the time the output switch SWi2 is opened, then input voltage Vin is impressed to capacitance Ci so that Ci is charged up to an electrical charge corresponding to a voltage difference between the reference voltage Vdd and the input voltage Vin. As a result, Ci keeps generating voltage Vin at the terminal connected to the input switch.

As mentioned above, input voltage Vin is held in a capacitance and then outputted by controlling the input and output switch. One output portion is commonly used for a plurality of capacitances and switches, one inverted amplifier is enough for a plurality of input voltages to be held. The circuit size is not very large relative to the circuit in FIG. 2, and much smaller than the sampling and holding circuit of FIG. 13. Therefore, this embodiment is effective for holding a lot of data in a limited circuit area.

Figure 12:
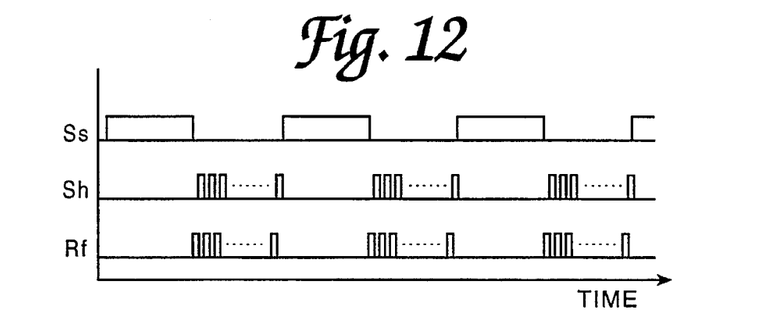
FIG. 12 is a timing chart of the circuit in FIG. 11.

One control signal Rf instead of two refresh signals and sampling and holding signals Ss and Sh are used for the circuit of the second embodiment. FIG. 12 is a timing chart of the embodiment. First, a sampling is performed by closing and opening of switches Sw11 to SWn1 successively. For example, first, SW11 is closed and then opened. Next, SW21 is closed and then opened. SW31 to SWn1 are similarly operated. So, successive analog input voltages are held in the capacitances C1 to Cn. This is the sampling of a plurality of data such as 256 successive data in time sequence. The sampling signal is given successively to switches SW11 to SWn1. FIG. 12 shows one long pulse as the total sampling time of the switches SW11 to SWn1. After the sampling, refreshment and holding are alternatively performed. Data in the capacitances are successively outputted through the switches SW12 to SWn2 toward the capacitance C0. SW12 to SWn2 are successively operated so as to output the data, and one cycle of the refreshment is executed before each operation of switches SW12 to SWn2. For example, first, the refresh signal Rf is given to the switches R1 and R2 for refreshing C0, Cf and I2. Next, SW12 is closed and then opened. The next refreshment is performed and SW22 is closed and then opened. SW32 to SWn2 are similarly operated. So, successive analog input voltages sampled are held in the following circuit as well as outputted to the second sampling and holding circuit. This is the holding of a plurality of data with refreshment. The refreshment for each holding compensates the accuracy of data to be outputted. The holding signal is given successively to the switches SW12 to SWn2. Input switches and output switches are controlled by a well known controlling circuit, for example, by a combination of circuit of a counter and a decoder.

The control of refresh switches R1 and R2 are performed by a circuit for opening and closing in response to the operation of input and output switches. The circuit may include a counter for counting a pulse with higher constant frequency than a clock pulse of the counter for the input and output switch, so that the refresh switches repeatedly open and close at a constant frequency.

It is possible to omit C0 and R2 by adjusting the capacity of C1 to Cn. The circuit is simplified by this omission. Since C0 is effective in preventing influences of parasitic capacitance of inverter I2, it is necessary to consider parasitic capacitance when C0 is omitted.

The second sampling and holding circuit performs sampling and holding by circuit stages including multi-stage inverters as mentioned above. The second circuit compensates the accuracy of the analog input voltage to be outputted.

The circuit in FIG. 11 is available for a circuit for sampling and holding of a plurality of analog input voltages independently from the second sampling and holding circuit SH2 and the multiplexer MUX. This independent circuit is advantageous that a lot of analog data can be sampled and held by a small circuit because the inverter is commonly used for a plurality of capacitances.

As mentioned above, according to the present invention, refresh noises are prevented by an auxiliary sampling and holding circuit which is used when the main sampling and holding circuit works.

What is claimed is:

1. A sample and hold circuit comprising:

a first sample and hold circuit having an output for outputting a first output voltage, said first sample and hold circuit being connected to an analog input voltage and receiving a first sampling signal, a first holding signal and a refresh signal, said first sample and hold circuit sampling said analog input voltage in response to said first sampling signal and holding said analog input voltage in response to said first holding signal, said first sample and hold circuit being refreshed for said sampling and holding in response to said refresh signal;

a second sample and hold circuit having an output for outputting a second output voltage, said second sample and hold circuit being connected to said output of said first sample and hold circuit and receiving a second sampling signal, a second holding signal and said refresh signal, said second sample and hold circuit sampling said first output voltage in response to said second sampling signal and holding said first output voltage in response to said second holding signal, said second sample and hold circuit being refreshed for said sampling and holding in response to said refresh signal; and a multiplexer having an output for outputting a third output voltage, said multiplexer being connected to said outputs of said first and second sample and hold circuits for alternatively providing said first output voltage or said second output voltage to said output as said third output voltage, said multiplexer providing said second output voltage as said third output voltage when said first sample and hold circuit is refreshed, said multiplexer otherwise providing said first output voltage as said third output voltage.

2. A sample and hold circuit as claimed in claim 1, wherein said refresh signal comprises:

a first refresh signal which comprises a first of said first refresh signal and a second of said first refresh signal, said first of said first refresh signal being inputted to said first sample and hold circuit for refreshing before said first sampling signal is inputted, said second of said first refresh signal being inputted to said first sample and hold circuit before said first holding signal is inputted; and a second refresh signal which comprises a first of said second refresh signal and a second of said second refresh signal, said first of said second refresh signal being inputted to said second sample and hold circuit for refreshing before said second sampling signal is inputted, said second of said second refresh signal being inputted to said second sample and hold circuit before said second holding signal is inputted.

3. A sample and hold circuit as claimed in claim 2, wherein said first sample and hold circuit comprises:

a first sampling circuit which comprises serially connected MOS inverters of an even number of stages, an output of a final stage being connected to an input of a first stage through a first feedback capacitance, said first sampling circuit being refreshed by discharging of electrical charges in response to said first refresh signal;

a first switch connecting said analog input voltage to said first sampling circuit through a first coupling capacitance, said first switch being closed in response to said first sampling signal;

a second switch connected to said output of said first sampling circuit, said second switch being closed in response to said first holding signal; and a first holding circuit which comprises serially connected MOS inverters of an even number of stages, an output of a final stage being connected to an input of a first stage through a second feedback capacitance, said first holding circuit being refreshed by discharging electrical charges in response to said second refresh signal.

4. A sample and hold circuit as claimed in claim 2, wherein said second sample and hold circuit comprises:

a second sampling circuit which comprises serially connected MOS inverters of an even number of stages, an output of a final stage being connected to an input of a first stage through a third feedback capacitance, said second sampling circuit being refreshed in response to said first refresh signal;

a third switch connecting said output of said first sample and hold circuit to said second sampling circuit through a third coupling capacitance, said third switch being closed in response to said second sampling signal;

a second holding circuit which comprises serially connected MOS inverters of an even number of stages, an output of a final stage being connected to an input of a first stage through a fourth feedback capacitance, said second holding circuit being refreshed in response to said first refresh signal; and a fourth coupling capacitance connecting said output of said second sampling circuit to said input of said second holding circuit.

5. A sample and hold circuit as claimed in claim 4, further comprising a fourth switch connected between said second sampling circuit and said fourth coupling capacitance, said fourth switch being closed when said second holding signal is inputted.

6. A sample and hold circuit as claimed in claim 5, wherein said first sampling signal, said second sampling signal and said second holding signal are commonly derived from the same signal.

7. A sample and hold circuit as claimed in claim 2, wherein said first and second of said first and second refresh signals comprise a first portion giving a term for discharging of electrical charge and a second portion giving a waiting time after said discharging.

8. A sample and hold circuit as claimed in claim 1, wherein said first sample and hold circuit comprises:
- a plurality of sampling capacitances having first and second terminals, a plurality of input switches commonly receiving said analog input voltage, each of said input switches being connected to said second terminal of a respective one of said plurality of sampling capacitances;
- a plurality of output switches, each of which is connected to said second terminal of a respective one of said plurality of sampling capacitances;
- an output capacitance commonly connected to said plurality of output switches;
- an inverting amplifier having an input connected to said output capacitance; and
- a feedback capacitance connected between an output and said input of said inverting amplifier.

9. A sample and hold circuit as claimed in claim 8, wherein said first sample and hold circuit further comprises a first refresh switch for short-circuiting said input and output of said inverting amplifier.

10. A sample and hold circuit as claimed in claim 9, wherein said first sampling and hold circuit further comprises a second refresh switch connected to said output capacitance in parallel with said plurality of output switches, said second refresh switch commonly connecting a reference voltage to said plurality of output switches.

11. A sample and hold circuit as claimed in claim 8, wherein said reference voltage is generated by a circuit of an inverting amplifier, an output and input of which are short-circuited with each other.

12. A sample and hold circuit as claimed in claim 8, wherein said first sample and hold circuit is used independently from said second sample and hold circuit so that said first output voltage from said first sample and hold circuit is directly used.

* * * * *